United States Patent
Kwon et al.

(10) Patent No.: US 10,263,128 B2
(45) Date of Patent: Apr. 16, 2019

(54) PHOTODETECTOR CONVERTING ULTRAVIOLET LIGHT INTO VISIBLE LIGHT

(71) Applicant: Kabushiki Kaisha Toshiba, Minato-ku (JP)

(72) Inventors: Honam Kwon, Kawasaki (JP); Ikuo Fujiwara, Yokohama (JP); Keita Sasaki, Yokohama (JP); Yuki Nobusa, Yokohama (JP); Kazuhiro Suzuki, Meguro (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/904,533

(22) Filed: Feb. 26, 2018

(65) Prior Publication Data

US 2019/0074388 A1    Mar. 7, 2019

(30) Foreign Application Priority Data

Sep. 5, 2017   (JP) .................................. 2017-170465

(51) Int. Cl.
| | | |
|---|---|---|
| *H01L 31/0232* | (2014.01) | |
| *H01L 27/144* | (2006.01) | |
| *H01L 31/0216* | (2014.01) | |

(52) U.S. Cl.
CPC .... *H01L 31/02322* (2013.01); *H01L 27/1446* (2013.01); *H01L 31/02162* (2013.01); *H01L 31/02327* (2013.01)

(58) Field of Classification Search
None
See application file for complete search history.

(56) References Cited

U.S. PATENT DOCUMENTS

| | | | |
|---|---|---|---|
| 8,803,263 B2 | 8/2014 | Yamada et al. | |
| 9,035,263 B2 * | 5/2015 | Iwata | G01T 1/2018 250/366 |
| 9,310,540 B2 | 4/2016 | Boonekamp et al. | |
| 2003/0030003 A1 * | 2/2003 | Maekawa | G01T 1/202 250/367 |
| 2006/0131289 A1 * | 6/2006 | Jyumonji | B23K 26/03 219/121.83 |
| 2006/0138351 A1 * | 6/2006 | Jyumonji | B23K 26/03 250/492.2 |
| 2010/0001195 A1 * | 1/2010 | Konkle | G01T 1/2018 250/370.09 |
| 2011/0198505 A1 * | 8/2011 | Ishida | G01T 1/202 250/363.01 |
| 2013/0119501 A1 | 5/2013 | Yoshida | |

(Continued)

FOREIGN PATENT DOCUMENTS

| | | |
|---|---|---|
| JP | 5-37000 | 2/1993 |
| JP | 9-210771 | 8/1997 |

(Continued)

*Primary Examiner* — Bilkis Jahan
(74) *Attorney, Agent, or Firm* — Oblon, McClelland, Maier & Neustadt, L.L.P.

(57) ABSTRACT

A photodetector includes
  a structure that converts ultraviolet light into visible light; and
  a photodetection element that detects the visible light converted by the structure,
  wherein the structure is provided on the photodetection element and protrudes in a predetermined shape on a side opposite to the photodetection element.

21 Claims, 7 Drawing Sheets

(56) References Cited

U.S. PATENT DOCUMENTS

| | | | |
|---|---|---|---|
| 2014/0061481 A1* | 3/2014 | Kondo | G01T 1/202 250/361 R |
| 2014/0166890 A1* | 6/2014 | Shimizu | C09K 11/06 250/369 |
| 2014/0353509 A1* | 12/2014 | Nakatsugawa | G01T 1/2018 250/361 R |
| 2016/0086989 A1 | 3/2016 | Yamamoto et al. | |
| 2016/0372611 A1* | 12/2016 | Isoda | H01L 31/024 |
| 2017/0299699 A1 | 10/2017 | Yonehara et al. | |
| 2018/0000364 A1 | 1/2018 | Yonehara et al. | |
| 2018/0000365 A1 | 1/2018 | Yonehara et al. | |
| 2018/0019444 A1 | 1/2018 | Yonehara et al. | |

FOREIGN PATENT DOCUMENTS

| | | |
|---|---|---|
| JP | 2006-4991 | 1/2006 |
| JP | 2012-15470 | 1/2012 |
| JP | 5819025 | 11/2015 |
| JP | 2017-98399 | 6/2017 |

* cited by examiner

PHOTODETECTOR CONVERTING ULTRAVIOLET LIGHT INTO VISIBLE LIGHT

CROSS-REFERENCE TO RELATED APPLICATIONS

This application is based upon and claims the benefit of priority from Japanese Patent Application No. 2017-170465, filed on Sep. 5, 2017, and the entire contents of which are incorporated herein by reference.

FIELD

Embodiments relate to a photodetector.

BACKGROUND

As a technique for detecting ultraviolet light with high sensitivity, there is known a technique of converting ultraviolet light into visible light and detecting the visible light with a photodetection element.

Of the converted visible light, obliquely scattered visible light is not incident on the photodetection element, and thus, a photodetection efficiency is lowered.

In addition, the obliquely scattered visible light is incident on adjacent photodetection elements, which causes crosstalk.

DETAILED DESCRIPTION

Figure 1:
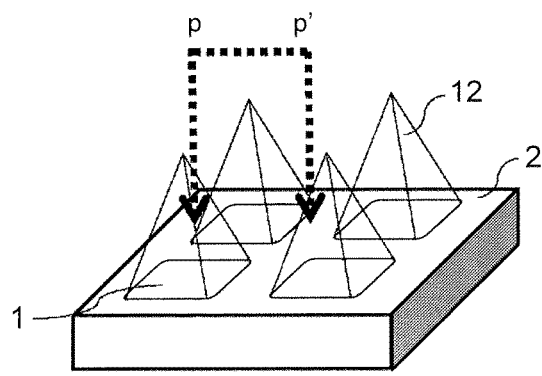
FIG. 1 is a diagram illustrating a photodetector according to a first embodiment.

Hereinafter, embodiments will be described with reference to the drawings.

Components denoted by the same reference numerals indicate corresponding ones. The drawings are schematic or conceptual, and a relationship between thickness and width of each portion, a ratio of sizes among portions, and the like are not necessarily the same as actual ones. In addition, even in the case of representing the same portions, the sizes and ratios of the portions may be different from each other depending on figures in the drawings.

First Embodiment

FIG. 1 is a diagram illustrating a photodetector according to a first embodiment. The photodetector can convert incident ultraviolet light into visible light and detect the light.

In FIG. 1, the photodetector includes a plurality of photodetection elements 1 arranged in an array shape, a non-photodetection region 2 provided between a plurality of the photodetection elements 1, and structures 12 that are provided to protrude on a side on which the ultraviolet light is incident, convert the ultraviolet light into visible light, and guide the converted visible light to the photodetection elements 1. Herein, the "upper" denotes the side on which the ultraviolet light is incident.

The photodetection element 1 detects the visible light by converting the visible light (for example, visible light from the structures 12) into an electric signal. The photodetection element is, for example, an avalanche photodiode.

The non-photodetection region 2 is a region in which incident light cannot be detected. The non-photodetection region 2 is a region where wires are densely provided in order that the electric signals converted by the photodetection elements 1 are wired to a driving/reading unit (not illustrated).

The structure 12 is provided in a shape of a quadrangular pyramid with the photodetection element 1 as a bottom surface. That is, it can be said that the structure 12 is provided on the photodetection element 1 and protrudes in a predetermined shape on the side opposite to the photodetection element 1.

Figure 2:
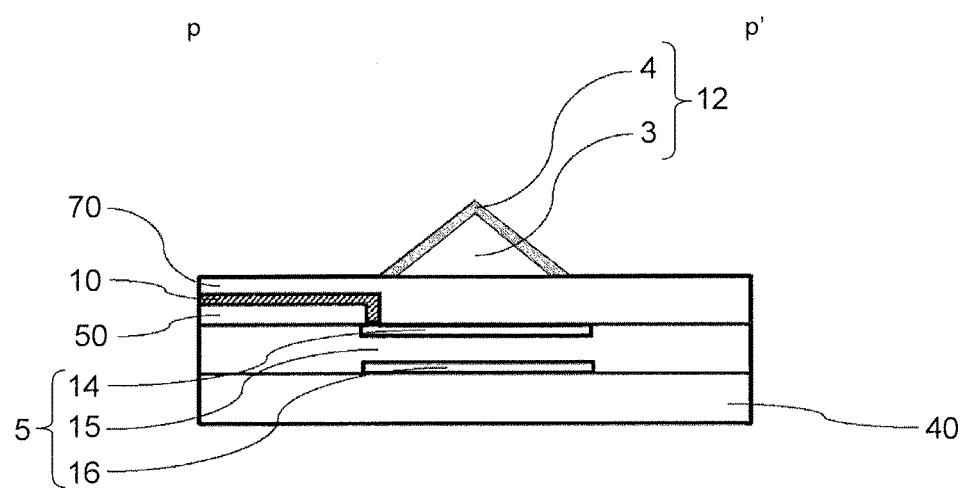
FIG. 2 is a diagram illustrating a p-p' cross section of a photodetection element illustrated in FIG. 1 according to the first embodiment.

FIG. 2 is a diagram illustrating a p-p' cross section of a photodetection element 1 of the photodetector illustrated in FIG. 1.

The photodetection element 1 includes an n type semiconductor layer 40 (sometimes, referred to as a first semiconductor layer), a p type semiconductor layer 5 (sometimes, referred to as a second semiconductor layer), an insulating layer 50, a first electrode 10, and a protective layer 70 protecting the first electrode 10.

In a p-p' cross section of FIG. 2, a p type semiconductor layer 5 is stacked on an n type semiconductor layer 40. The p type semiconductor layer 5 includes a p$^-$ layer 15, a p$^+$ layer 16 provided in at least a portion of a lower surface of the p$^-$ layer 15, and a p$^|$ layer 14 provided in at least a portion of an upper surface of the p$^-$ layer 15. An insulating layer 50 is provided on a portion of the p type semiconductor layer 5. An upper surface and a side surface of the insulating layer 50 are covered with a first electrode 10, respectively. In addition, the first electrode 10 is electrically connected to the p$^+$ layer 14.

A protective layer 70 is provided so as to cover an upper surface of the first electrode 10 and a side surface of the first electrode 10.

In addition, the p$^+$ layer 14 is a light-receiving surface. The first electrode 10 is provided between the insulating layer 50 and the protective layer 70. However, the p-p' cross section is a cross section taken along the plane including the stacking direction and the plane direction (horizontal direction).

The structure 12 on the protective layer 70 includes a resin layer 3 and a first scintillator 4 (first wavelength conversion layer).

The resin layer 3 has a shape of a triangle (a triangle protruding toward the light incident side from the photodetection element 1) with the protective layer 70 side as a bottom side in the p-p' cross section. The first scintillator 4 is provided on the resin layer 3 so as to cover along the shape (the inclined surface of the triangle) of the resin layer 3. In addition, the resin layer 3 does not transmit the ultraviolet light that is not be converted by the first scintillator 4 but transmits the visible light that is converted by the first scintillator 4. That is, it can be said that the resin layer 3 is optically transparent with respect to visible light and is not optically transparent with respect to ultraviolet light.

The photodetector according to the embodiment photoelectrically converts the visible light converted by the first scintillator 4 into an electric signal between the p type semiconductor layer 5 and the n type semiconductor layer 40 and wires the electric signal to a driving/reading unit (not illustrated) to detect the light.

The first electrode 10 is provided to transmit the photoelectrically converted electric signal to a driving/reading unit (not illustrated). The material of the first electrode 10 is, for example, aluminum, an aluminum-containing material, or other metal materials.

The insulating layer 50 is provided so that the first electrode 10 is not electrically connected to surrounding wires. The material of the insulating layer 50 is, for example, a silicon oxide film or a silicon nitride film.

The protective layer 70 is provided as a function of protecting the first electrode 10 so as not to be short-circuited by contacting with the outside and as a function of suppressing the reflection due to a high reflective index of silicon. The material of the protective layer 70 is, for example, a silicon oxide film or a silicon nitride film.

In the photodetection element 1 illustrated in FIG. 2, the first scintillator 4 receives ultraviolet light from the upper side and converts the ultraviolet light into visible light. The resin layer 3 transmits most of the visible light converted by the first scintillator 4 to the protective layer 70 side. Specifically, a portion of the visible light converted by the first scintillator 4 passes through the resin layer 3 as it is and reaches the protective layer 70. Another portion of the visible light converted by the first scintillator 4 passes through the resin layer 3, is reflected on the inclined surface (another interface between the first scintillator 4 and the resin layer 3) of the first scintillator 4 that is different from the inclined surface (the interface between the first scintillator 4 and the resin layer 3) of the first scintillator which has converted the ultraviolet light, and after that, can reach the protective layer 70.

On the other hand, the remaining portion of the converted visible light is reflected towards the outside by the interface between the resin layer 3 and the first scintillator 4.

In the embodiment, the resin layer 3 is provided in a shape of a quadrangular pyramid with the protective layer 70 as a bottom surface. The bottom area of the quadrangular pyramid of the resin layer 3 is almost equal to the light reception area, and the resin layer 3 is provided right above the light-receiving surface. If a resin layer 3 having the same bottom area of the quadrangular pyramid as the light reception area is provided just above the light-receiving surface, the visible light converted by the first scintillator 4 is less likely to be incident on the adjacent photodetection element 1.

The reason for the reflected light (visible light) gathering on the light-receiving surface if a resin layer 3 having a triangular cross section exists will be described later with reference to FIG. 4.

In a configuration different from that in FIG. 2, in a case where the resin layer 3 is provided not just above the light-receiving surface but over the adjacent photodetection element 1, the converted visible light (reflected light) is incident on the adjacent photodetection element 1, which causes noise such as crosstalk. The resin layer 3 is preferably a resin material with a good transmittance of, for example, visible light, and the shape described above is formed by accurately imprinting just on the light-receiving surface.

The first scintillator 4 is provided to convert the wavelength of light incident from the upper side of the photodetector (that is, to convert ultraviolet light into visible light). In addition, the first scintillator 4 is provided on the resin layer 3 in a shape corresponding to the outer shape of the resin layer 3. The material of the first scintillator 4 is, for example, Alq3, ZnS, or coumarin-based fluorescent coloring matter or phosphor.

Herein, with respect to the case (comparative example) where there is no resin layer 3 and the first scintillator 4 is provided directly on the protective layer 70 and the case (the embodiment) where the first scintillator 4 is provided on the resin layer 3 having a triangular cross section, the optical paths of the visible light are compared.

Figure 3:
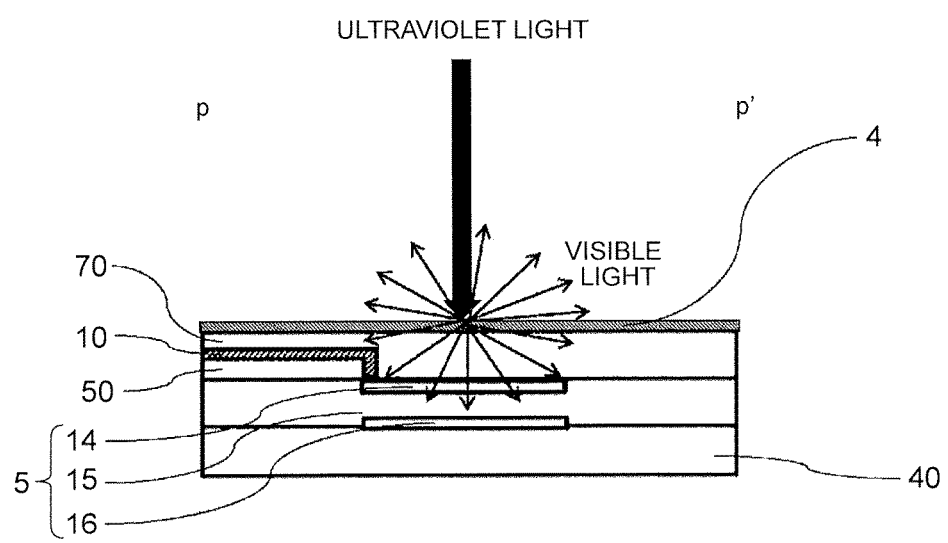
FIG. 3 is a diagram illustrating an optical path of a photodetection element according to a comparative example.

First, a case where the resin layer 3 having a triangular cross section is not provided will be described. FIG. 3 is a diagram illustrating a p-p' cross section of a photodetector according to a comparative example. As illustrated in FIG. 3, when the first scintillator 4 is provided directly on the protective layer 70, the first scintillator 4 is formed so as to cover the protective layer along the outer shape of the protective layer 70. In this case, when the first scintillator converts the ultraviolet light incident from above the photodetector into visible light, the visible light is scattered in almost all directions (360°). Of the visible light scattered in all directions, the visible light scattered at about 180° is the visible light that is scattered toward the photodetection element 1 side. In addition, with respect to the visible light scattered toward the photodetection element 1 side, the visible light of which the acute angle between the plane direction (horizontal direction) and the visible light is about 0° is obliquely incident, and thus, the visible light is not incident on the light-receiving surface. In addition, the visible light of which the acute angle between the plane direction and the visible light reaches 0° is highly likely to be incident on the adjacent photodetection element 1, which causes crosstalk.

Figure 4A:
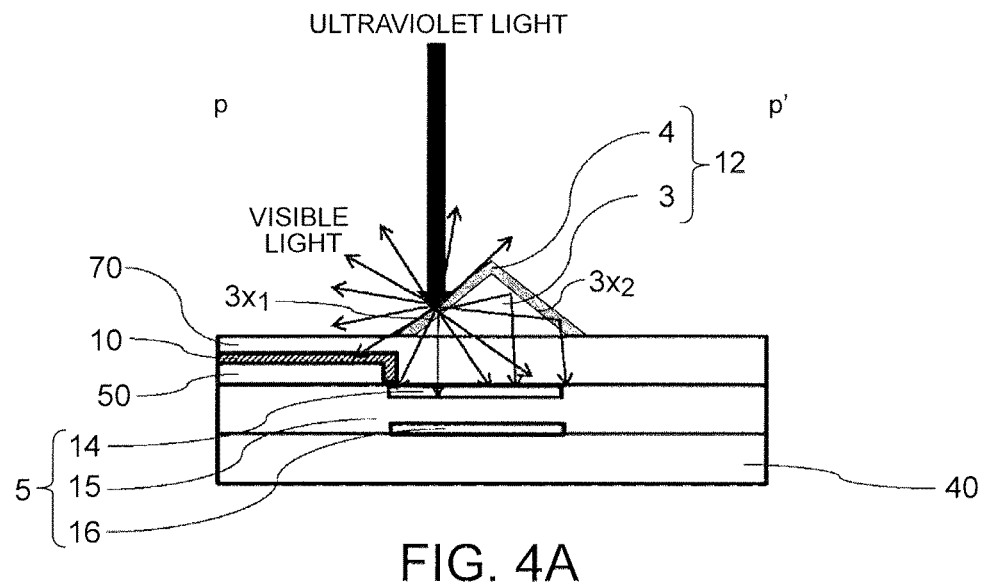
FIG. 4A and FIG. 4B are diagrams illustrating a p-p' cross section of the photodetector according to the first embodiment.
Figure 4B:
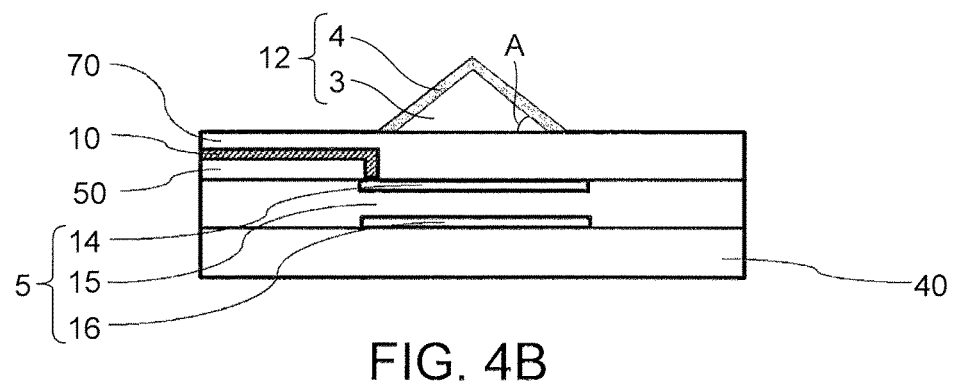

FIG. 4A is a diagram illustrating a p-p' cross section of the photodetector according to the embodiment. In a case where the first scintillator 4 is formed on the resin layer 3 which has a shape of a quadrangular pyramid with the protective layer 70 as a bottom surface, the visible light converted by the first scintillator 4 having a shape along an inclined surface of a triangular cross section passes through the inside of the resin layer 3 and is totally reflected by the inclined surface $3x_2$ that is different from the inclined surface $3x_1$ that has converted into the visible light. Since the acute angle between the totally reflected visible light and the plane direction approaches the right angle, the visible light that is obliquely incident on the photodetection element 1 is decreased. For this reason, the photodetection efficiency of the visible light converted by the first scintillator 4 is improved as compared with a case where the resin layer 3 having a triangular cross section is not provided. In addition, when the acute angle between the plane direction and the visible light approaches the right angle, the visible light incident on the adjacent photodetection element 1 is decreased, and thus, it is possible to provide a photodetector with less crosstalk.

The acute angle between the inclined side (the inclined side of the triangle) of the appropriate resin layer 3 and the plane direction (horizontal direction) is described by using the p-p' cross section in FIG. 2. This acute angle between the inclined side of the resin layer 3 and the plane direction is denoted as an angle A in FIG. 4B.

When the thickness of the resin layer 3 is not changed and the acute angle between the inclined surface of the resin layer 3 and the plane direction approaches 0°, the amount of light incident on the light-receiving surface is increased and, thus, the photodetection efficiency is increased. However, the visible light incident along the first scintillator 4 tends to be incident on the adjacent photodetection element 1, and thus, crosstalk is increased.

On the other hand, when the thickness of the resin layer 3 is not changed and the acute angle between the inclined surface of the resin layer 3 and the plane direction reaches 90°, the visible light incident along the first scintillator 4 tends to be incident on the light-receiving surface, and thus, crosstalk is decreased. However, when the above acute angle approaches 90°, the total reflection condition is relaxed, so the amount of light incident on the light-receiving surface is decreased, and thus, the photodetection efficiency is decreased.

According to the present embodiment, a photodetector with less crosstalk by increasing a photodetection efficiency of a photodetection element is provided.

That is, with respect to the acute angle between the inclined surface of the resin layer 3 and the plane direction, the photodetection efficiency and the crosstalk are in a trade-off relation. Therefore, as a result of investigating various angles, it was found that the acute angle between the inclined surface of the triangle of the resin layer 3 and the plane direction in the p-p' cross section is preferably 30° to 45°.

With respect to the photodetection element 1 according to the embodiment, the transparent resin layer having a triangular cross section is provided on the photodetection element, and the scintillator formed along the outer shape of the resin layer is provided thereon. After the incident ultraviolet light is converted into the visible light by scintillator, by making use of the shape characteristics, the amount of light incident on the light-receiving surface of the photodetection element 1 is increased, and thus, the photodetection efficiency is increased as compared with the related art. In addition, since the visible light scattered obliquely with respect to the photodetection element is decreased, the photodetection element 1 according to the embodiment can suppress crosstalk. Furthermore, in the related art, when the ultraviolet light which cannot be converted by the scintillator 4 is incident on the photodetection element and photo-electrically converted near the interface between the protective layer 70 and the p$^+$ layer 16, noise is generated. However, in the embodiment, the resin layer 3 totally reflects or cuts the ultraviolet light, and thus, it is possible to implement the photodetection element 1 with less noise.

Figure 5:
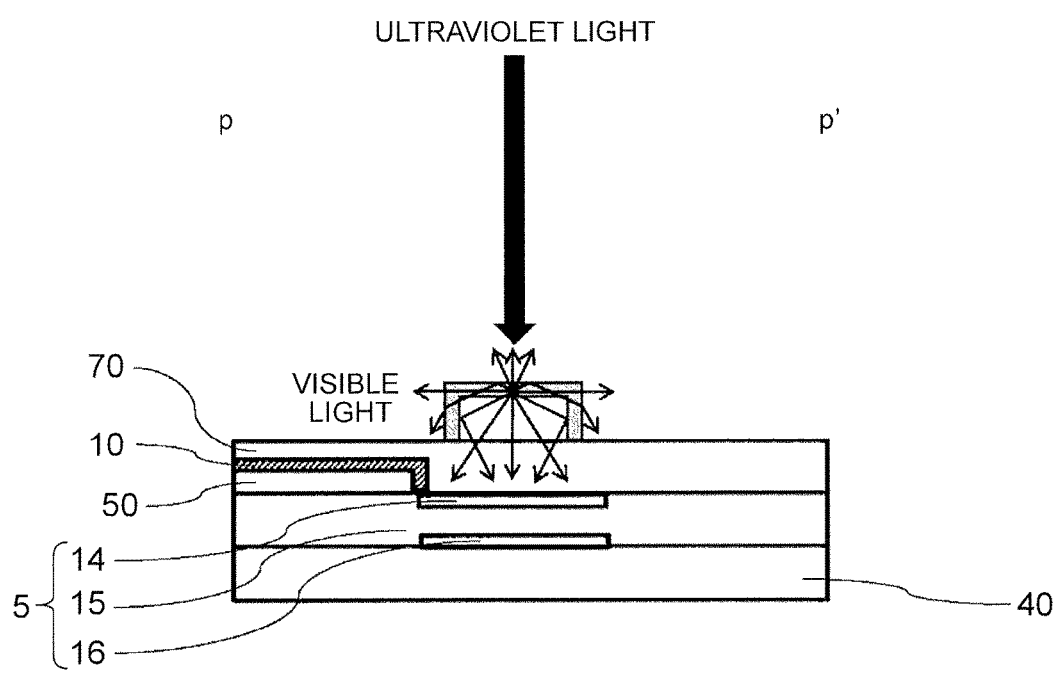
FIG. 5 is a diagram illustrating an optical path of a photodetection element in a case where a shape of a cross section of a resin layer is a quadrangle.
Figure 6:
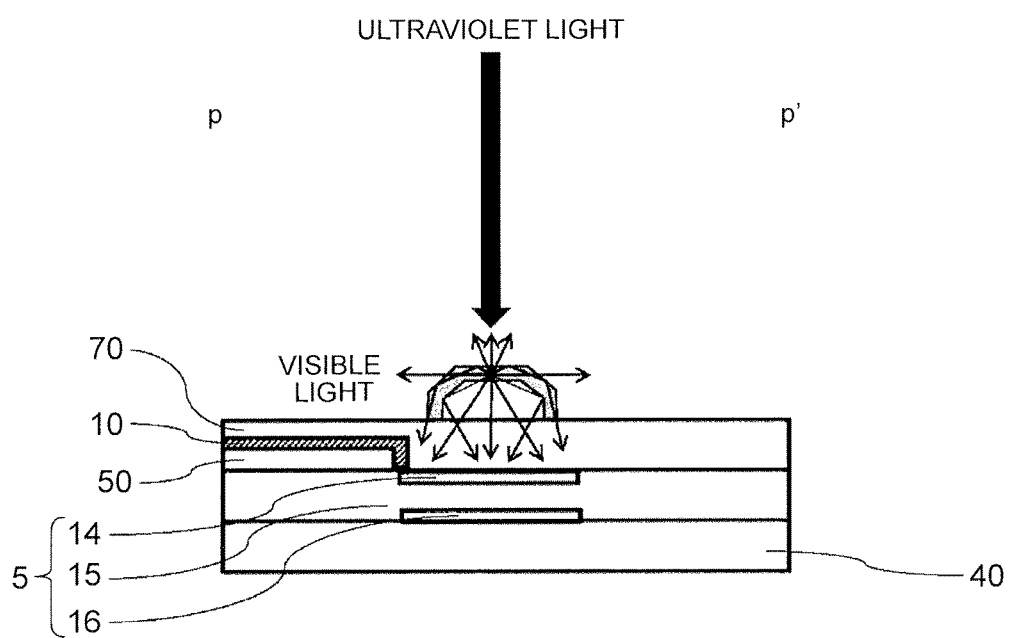
FIG. 6 is a diagram illustrating an optical path of a photodetection element in a case where a shape of a cross section of a resin layer is a polygon.

In addition, regardless of the example of FIG. 2, the cross-sectional shape of the resin layer 3 may be hemispherical. As illustrated in FIG. 5, the cross-sectional shape may be a quadrilateral. As illustrated in FIG. 6, the cross-sectional shape may be a polygon. Along with the resin layers 3 described above, the first scintillator 4 may be provided on the resin layers 3. In FIG. 5, almost the ultraviolet light incident on the first scintillator layer 4 enters the upper surface of the photodetection element 1 to be converted into visible light. A portion of the converted visible light becomes a component causing crosstalk and travels in the resin layer 3, but since the portion of the converted visible light is refracted or reflected on the side surface of the resin layer 3, crosstalk is suppressed. In FIG. 6, similarly to FIG. 5, the ultraviolet light incident on the first scintillator layer 4 almost enters the upper surface of the photodetection element 1 to be converted into visible light. A portion of the converted visible light becomes a component causing crosstalk and travels in the resin layer 3, but since the portion of the converted visible light is refracted or reflected on the side surface of the resin layer 3, crosstalk is suppressed. Furthermore, the visible light reflected by the inclined surface of a polygon is gathered on the photodetection element 1 side, and the effect of suppressing crosstalk is improved as compared with FIG. 5.

In addition, without limiting to the example of FIG. 2, the first semiconductor layer 40 may be a p type semiconductor layer, and the second semiconductor layer 5 may be an n type semiconductor layer.

In addition, the reflective indexes of the first scintillator 4 and the resin layer 3 may be set almost the same with respect to the visible light.

Second Embodiment

Figure 7:
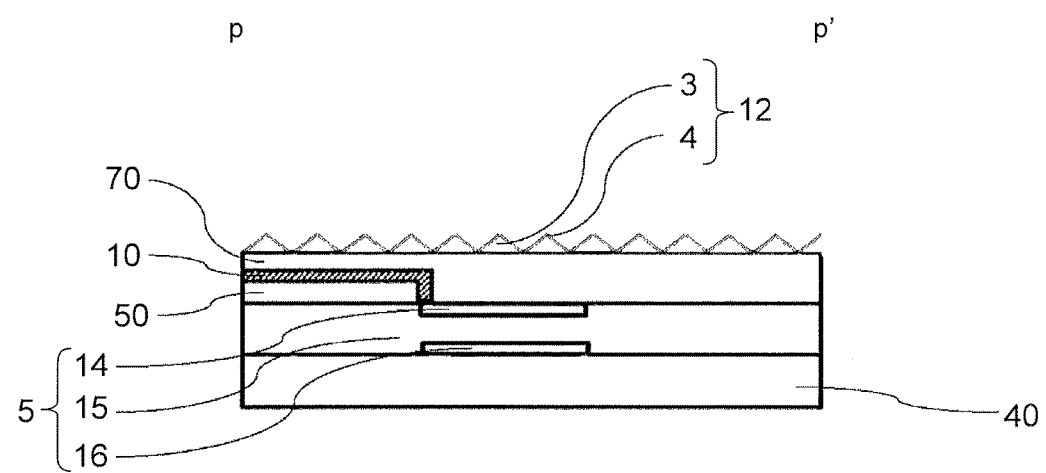
FIG. 7 is a diagram illustrating a photodetector according to a second embodiment.

The points different from those of the first embodiment will be mainly described. FIG. 7 is a diagram illustrating a p-p' cross section of a photodetector according to a second embodiment.

In the first embodiment, one quadrangular pyramid of the resin layer 3 is provided to one photodetection element 1. However, in the photodetector according to the embodiment, the bottom area of the quadrangular pyramid of the resin layer 3 is formed to be smaller than the light reception area, and thus, a larger number of quadrangular pyramids of the resin layers 3 can be provided to one photodetection element 1 to be spread not only just above the light-receiving surface but also on the upper surface of the protective layer 70. The height of the resin layers 3 is preferably such a height that the acute angle between the inclined side of the triangular cross section of the resin layer 3 and the plane direction in the p-p' cross section is 30° to 45°.

In the first embodiment, since the resin layer 3 having the same bottom area as the light reception area is imprinted right above the light-receiving surface, positioning is necessary, and the accuracy of imprinting is also required. However, in this embodiment, since it is only necessary to allow the bottom area of the quadrangular pyramid to be smaller than the light reception area and spread a larger number of the quadrangular pyramids all over the upper surface of the protective layer 70, positioning just above the light-receiving surface is not necessary, and thus, the accuracy of imprinting is not required, so that it is possible to easily and conveniently manufacture the photodetector.

Third Embodiment

Figure 8:
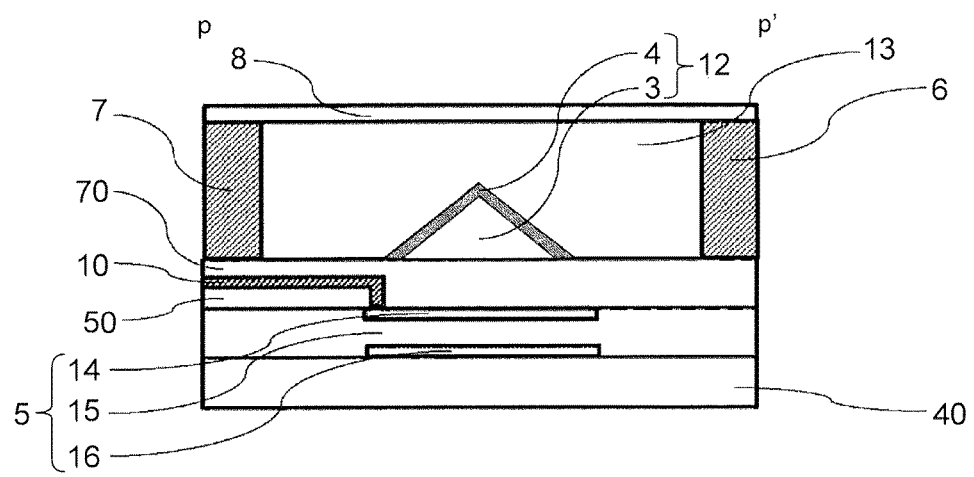
FIG. 8 is a diagram illustrating a photodetector according to a third embodiment.

The points different from those of the first embodiment will be mainly described. FIG. 8 is a diagram illustrating a p-p' cross section of the photodetector according to a third embodiment.

As illustrated in FIG. 8, the photodetector according to the embodiment further includes a second scintillator 8 (second wavelength conversion layer) provided on the first scintillator 4, adhesive layers 6 and 7 which adheres the protective layer 70 and the second scintillator 8 in order to provide the second scintillator 8 on the first scintillator 4, and an air layer 13 that is provided between the first scintillator 4 and the second scintillator 8.

The second scintillator 8 is provided to convert a neutron ray such as neutron radiation, neutron beam, into ultraviolet light. The first scintillator 4 converts the ultraviolet light into visible light.

The material of the second scintillator 8 is, for example, LiCAF.

The photodetector according to the embodiment can also detect a neutron ray by combining a second scintillator which converts the neutron ray into ultraviolet light and a first scintillator which converts the ultraviolet light into visible light, and thus, the photodetector can also be applied to a decommissioning of nuclear reactor/plant or the like.

While several embodiments of the invention have been described above, the above-described embodiments have been presented by way of examples only, and the embodiments are not intended to limit the scope of the invention. The embodiments described herein may be embodied in a variety of other forms; furthermore, various omissions, substitutions, and changes in the form of the embodiments described herein may be made within the scope without departing from the spirit of the invention. The embodiments and modifications thereof are included in the scope and spirit of the invention and fall within the scope of the invention described in the claims and the equivalents thereof.

What is claimed is:

1. A photodetector comprising:
   a structure that converts ultraviolet light into visible light; and
   a photodetection element that detects the visible light converted by the structure,
   wherein the structure is provided on the photodetection element and protrudes in a predetermined shape on a side opposite to the photodetection element,
   the structure includes a first scintillator that converts the ultraviolet light into the visible light and a resin layer that is light transmissive with respect to the visible light,
   wherein, in a cross-sectional view of the resin layer taken along a plane including a stacking direction and a plane direction, an acute angle between an inclined surface of the resin layer and the plane direction is 30° to 45°.

2. The photodetector according to claim 1, wherein the first scintillator is provided on the resin layer so as to cover the resin layer along an outer shape of the resin layer.

3. The photodetector according to claim 1, wherein the first scintillator is on the ultraviolet light incident side, and the resin layer is on the photodetection element side.

4. The photodetector according to claim 1, wherein a portion of the visible light converted by the first scintillator is transmitted through an inside of the resin layer, is reflected by an interface between the first scintillator and the resin layer, and is incident on the photodetection element.

5. The photodetector according to claim 1, wherein the resin layer totally reflects the ultraviolet light.

6. The photodetector according to claim 1, wherein the resin layer is not optically transparent with respect to the ultraviolet light.

7. The photodetector according to claim 1, wherein the predetermined shape has a triangular cross section with the photodetection element side as a bottom surface when viewed from the ultraviolet light incident side.

8. The photodetector according to claim 1, wherein, a plurality of the structure are provided.

9. The photodetector according to claim 1, further comprising a second scintillator that converts a wavelength different from that of the first scintillator, wherein the second scintillator is provided on the first scintillator.

10. The photodetector according to claim 9, wherein the second scintillator converts a neutron ray to ultraviolet light.

11. A photodetector comprising:
    a structure that converts ultraviolet light into visible light; and
    a photodetection element that detects the visible light converted by the structure,
    wherein the structure is provided on the photodetection element and protrudes in a predetermined shape on a side opposite to the photodetection element,
    the structure includes a first scintillator that converts the ultraviolet light into the visible light and a resin layer that is light transmissive with respect to the visible light,
    the photodetector further comprising a second scintillator that converts a wavelength different from that of the first scintillator, wherein the second scintillator is provided on the first scintillator,
    the second scintillator converts a neutron ray to ultraviolet light.

12. The photodetector according to claim 11, wherein the first scintillator is provided on the resin layer so as to cover the resin layer along an outer shape of the resin layer.

13. The photodetector according to claim 11, wherein the first scintillator is on the ultraviolet light incident side, and the resin layer is on the photodetection element side.

14. The photodetector according to claim 11, wherein a portion of the visible light converted by the first scintillator is transmitted through an inside of the resin layer, is reflected by an interface between the first scintillator and the resin layer, and is incident on the photodetection element.

15. The photodetector according to claim 11, wherein the resin layer totally reflects the ultraviolet light.

16. The photodetector according to claim 11, wherein the resin layer is not optically transparent with respect to the ultraviolet light.

17. The photodetector according to claim 11, wherein the predetermined shape has a triangular cross section with the photodetection element side as a bottom surface when viewed from the ultraviolet light incident side.

18. The photodetector according to claim 11, wherein the predetermined shape has a hemispherical cross section with the photodetection element side as a bottom surface when viewed from the ultraviolet light incident side.

19. The photodetector according to claim 11, wherein the predetermined shape has a quadrilateral cross section with the photodetection element side as a bottom surface when viewed from the ultraviolet light incident side.

20. The photodetector according to claim 11, wherein the predetermined shape has a polygonal cross section with the photodetection element side as a bottom surface as viewed from the light incident side.

21. The photodetector according to claim 11, wherein, a plurality of the structure are provided.

* * * * *